United States Patent
Wang et al.

(10) Patent No.: US 11,130,420 B2
(45) Date of Patent: Sep. 28, 2021

(54) SYSTEM AND METHOD FOR CHARGE CONTACTOR WELD CHECK

(71) Applicant: FORD GLOBAL TECHNOLOGIES, LLC, Dearborn, MI (US)

(72) Inventors: Rui Wang, Canton, MI (US); Yuan Zhang, Southgate, MI (US); Xu Wang, Northville, MI (US); Jeffery R. Grimes, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 319 days.

(21) Appl. No.: 16/376,650

(22) Filed: Apr. 5, 2019

(65) Prior Publication Data
US 2020/0317076 A1    Oct. 8, 2020

(51) Int. Cl.
| | |
|---|---|
| *B60L 53/62* | (2019.01) |
| *B60L 53/14* | (2019.01) |
| *B60L 3/12* | (2006.01) |
| *G07C 5/08* | (2006.01) |
| *G01R 31/00* | (2006.01) |
| *H01H 47/00* | (2006.01) |
| *B60K 6/22* | (2007.10) |

(52) U.S. Cl.
CPC ............... *B60L 53/62* (2019.02); *B60L 3/12* (2013.01); *B60L 53/14* (2019.02); *G01R 31/007* (2013.01); *G07C 5/0825* (2013.01); *H01H 47/002* (2013.01); *B60K 6/22* (2013.01); *B60Y 2200/91* (2013.01); *B60Y 2200/92* (2013.01); *B60Y 2300/91* (2013.01)

(58) Field of Classification Search
CPC .. B60L 53/62; B60L 53/14; B60L 3/12; B60L 3/0023; B60L 53/00; B60L 58/12; G07C 5/0825; G01R 31/007; G01R 31/3278; G01R 31/006; H01H 47/002; B60Y 2300/91; B60Y 2200/91; B60Y 2200/92; B60K 6/22; Y02T 90/14; Y02T 90/12; Y02T 10/7072; Y02T 10/70
See application file for complete search history.

(56) References Cited

U.S. PATENT DOCUMENTS

| | | | |
|---|---|---|---|
| 7,368,829 B2 | 5/2008 | Tezuka | |
| 9,434,261 B2 | 9/2016 | Bemrich et al. | |
| 2010/0250194 A1* | 9/2010 | Newhouse | H01H 47/001 702/183 |

FOREIGN PATENT DOCUMENTS

CN          106564391          4/2017

\* cited by examiner

*Primary Examiner* — Nha T Nguyen
(74) *Attorney, Agent, or Firm* — Brooks Kushman PC; David Kelley

(57) ABSTRACT

A power distribution system for a vehicle includes contactors that selectively electrically couple a charger to a high-voltage bus. The contactors are closed at the start of a charge event in an order that alternates for successive charge events. Upon completion of the charge event, the last closed contactor at the start of the charge event is opened first and a weld check is performed. If the weld check is indicative of a welded contactor, then the weld check is performed on the other contactor.

20 Claims, 4 Drawing Sheets

SYSTEM AND METHOD FOR CHARGE CONTACTOR WELD CHECK

TECHNICAL FIELD

This application generally relates to detecting a welded contactor between a charger and a high-voltage power bus in a vehicle.

BACKGROUND

Electrified vehicles include high-voltage components that are connected to a high-voltage bus. The high-voltage bus may include elements that selectively isolate the high-voltage components from one another. During normal conditions, the selective isolation elements may operate properly. However, under abnormal conditions, the selective isolation elements may be in an improper state.

SUMMARY

A vehicle includes a charger, and contactors configured to selectively electrically couple positive and return terminals of the charger to corresponding terminals of a traction battery. The vehicle further includes a controller programmed to (i) responsive to a start of a charge event, command the contactors to close in an order that alternates for successive charge events, and (ii) responsive to completion of the charge event, command a last closed of the contactors to open and, responsive to a charger voltage measured across the terminals of the charger being within a predetermined voltage of a battery voltage measured across the terminals of the traction battery, inhibit subsequent charge events.

The controller may be further programmed to, responsive to inhibiting subsequent charge events, command a first closed of the contactors to open. The controller may be further programmed to inhibit operation of the vehicle responsive to the charger voltage being within the predetermined voltage of the battery voltage after commanding the first closed of the contactors to open. The controller may be further programmed to, responsive to inhibiting vehicle operation, cause a vehicle display to activate a display element indicative of a double welded contactor condition. The controller may be further programmed to, responsive to inhibiting vehicle operation, cause a vehicle display to activate a display element indicative of a loss of vehicle operation. The controller may be further programmed to, responsive to inhibiting subsequent charge events, cause a vehicle display to activate a display element indicative of a single welded contactor condition. The controller may be further programmed to, responsive to inhibiting subsequent charge events, cause a vehicle display to activate a display element indicative of a loss of charging capability.

A power distribution system for a vehicle includes contactors configured to selectively electrically couple positive and return terminals of a charger to corresponding conductors of a high-voltage bus. The power distribution system further includes a controller programmed to (i) responsive to a start of a charge event, command the contactors to close in an order that alternates for successive charge events, and (ii) responsive to completion of the charge event, command a last closed of the contactors to open and perform a weld check, and (iii) responsive to a welded contactor condition being satisfied, inhibit subsequent charge events.

The welded contactor condition may include a first voltage measured across the terminals of the charger being within a predetermined voltage of a second voltage measured across the conductors of the high-voltage bus. The controller may be further programmed to, responsive to inhibiting subsequent charge events, command a first closed of the contactors to open and perform the weld check. The controller may be further programmed to, responsive to the welded contactor condition being satisfied, inhibit vehicle operation. The controller may be further programmed to, responsive to inhibiting vehicle operation, output a signal to a vehicle display indicative of vehicle operation being inhibited. The controller may be further programmed to, responsive to the welded contactor conditions not being satisfied, command a first closed contactor to open.

A method includes, by a controller in a vehicle, responsive to a start of a charge event, commanding contactors that selectively electrically couple positive and return terminals of a charger to corresponding conductors of a high-voltage bus to close in an order that alternates for successive charge events. The method further includes responsive to completion of the charge event, commanding a one of contactors that was closed last at the start of the charge event to open and performing a weld check and inhibiting subsequent charge events responsive to a welded contactor condition being satisfied.

The welded contactor condition may include a first voltage measured across the terminals of the charger being within a predetermined voltage of a second voltage measured across the conductors of the high-voltage bus. The method may further include, responsive to inhibiting subsequent charge events, commanding the contactor that was first closed at the start of the charge event to open and performing a weld check. The method may further include, responsive to the welded contactor condition being satisfied, inhibiting vehicle operation. The method may further include, responsive to inhibiting vehicle operation, displaying an indicator on a vehicle display indicative of vehicle operation being inhibited. The method may further include, responsive to the welded contactor conditions not being satisfied, commanding the contactor that was first closed at the start of the charge event to open. The method may further include, responsive to inhibiting subsequent charge events, displaying an indicator on a vehicle display indicative of subsequent charge events being inhibited.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Electrified vehicles include contactors to selectively connect and isolate high-voltage components. The contactors may be electromagnetic switches such as relays. In a high-voltage environment, switches can experience high levels of stress. The high voltages present in an electrified vehicle can cause an electrical arc between the switch contacts. The electrical arcing may occur as the switch opens or closes. The temperature of the electrical arc can be high enough to cause the switch contacts to melt. In severe cases, the contactor can become welded closed.

Figure 1:
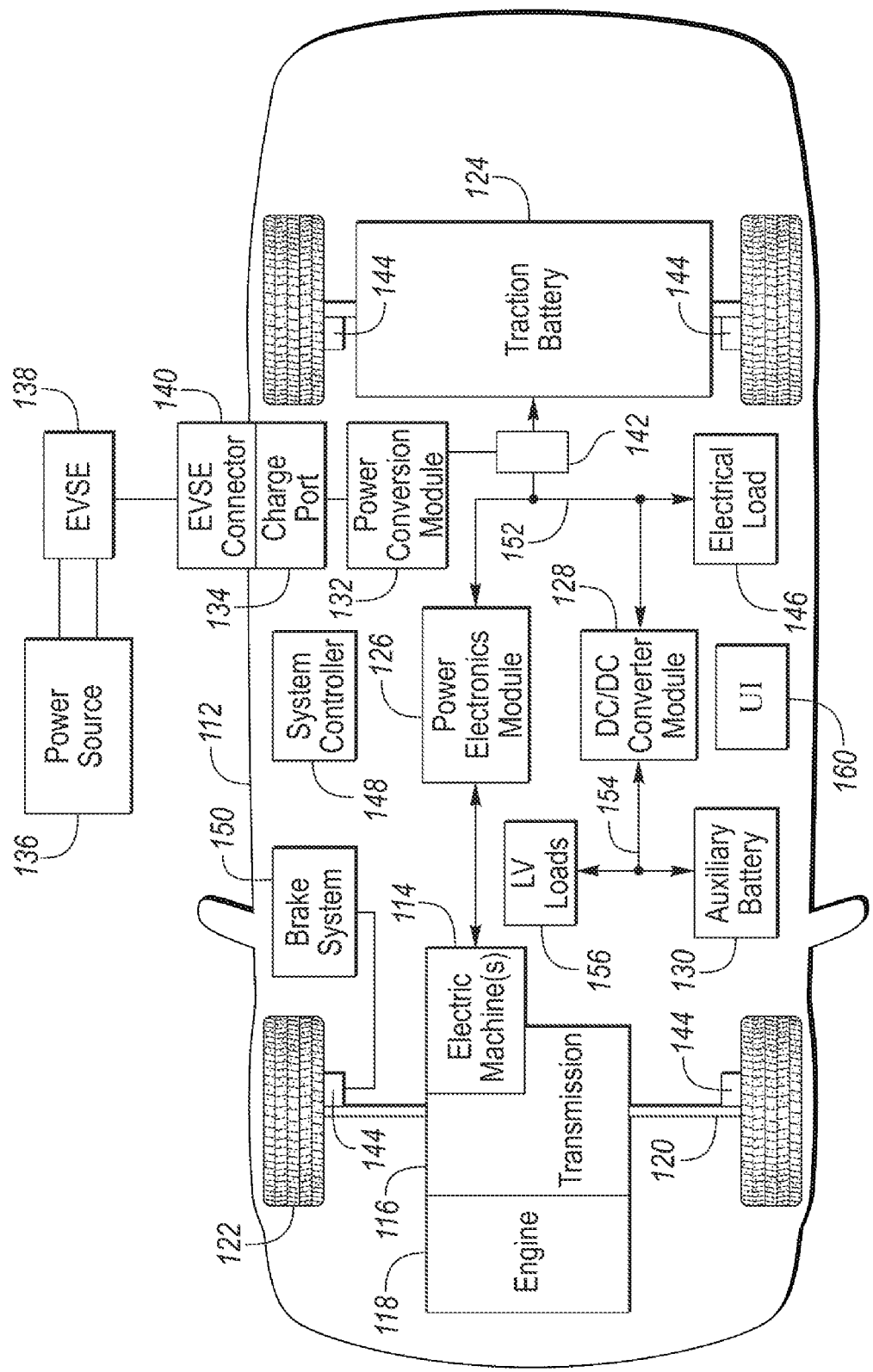
FIG. 1 depicts a possible configuration for an electrified vehicle.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a gearbox or hybrid transmission 116. The electric machines 114 may be capable of operating as a motor and a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A battery pack or traction battery 124 stores energy that can be used by the electric machines 114. The traction battery 124 may provide a high voltage direct current (DC) output. A contactor module 142 may include one or more contactors configured to isolate the traction battery 124 from a high-voltage bus 152 when opened and connect the traction battery 124 to the high-voltage bus 152 when closed. The high-voltage bus 152 may include power and return conductors for carrying current over the high-voltage bus 152. The contactor module 142 may be located in the traction battery 124. One or more power electronics modules 126 (also known as an inverter) may be electrically coupled to the high-voltage bus 152. The power electronics modules 126 are also electrically coupled to the electric machines 114 and provide the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

In addition to providing energy for propulsion, the traction battery 124 may provide energy for other vehicle electrical systems. The vehicle 112 may include a DC/DC converter module 128 that converts the high voltage DC output from the high-voltage bus 152 to a low-voltage DC level of a low-voltage bus 154 that is compatible with low-voltage loads 156. An output of the DC/DC converter module 128 may be electrically coupled to an auxiliary battery 130 (e.g., 12V battery) for charging the auxiliary battery 130. The low-voltage loads 156 may be electrically coupled to the auxiliary battery 130 via the low-voltage bus 154. One or more high-voltage electrical loads 146 may be coupled to the high-voltage bus 152. The high-voltage electrical loads 146 may have an associated controller that operates and controls the high-voltage electrical loads 146 when appropriate. Examples of high-voltage electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charge station or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for coupling to a charge port 134 of the vehicle 112. The charge port 134 may be any type of port configured to transfer power from the EVSE 138 to the vehicle 112. The charge port 134 may be electrically coupled to an on-board power conversion module or charger. The charger 132 may condition the power supplied from the EVSE 138 to provide the proper voltage and current levels to the traction battery 124 and the high-voltage bus 152. The charger 132 may be electrically coupled to the contactor module 142. The charger 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

Wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

The electrified vehicle 112 may further include a user interface 160. The user interface 160 may provide a variety of display elements for communicating information to the operator. The user interface 160 may provide a variety of input elements for receiving information from the operator. The user interface 160 include one or more displays. The displays may be touch-screen displays. The user interface 160 may include discrete lamps/lights. For example, the lamps may include light-emitting diodes (LED). The user interface 160 may include switches, rotary knobs, and buttons for allowing the operator to change various settings. The user interface 160 may include a control module that communicates via the vehicle network. The user interface 160 may provide one or more display elements that are indicative of charging being inhibited and vehicle operation being inhibited. The user interface 160 may also provide display elements for indicating a single contactor weld condition and a double contactor weld condition. The display elements may include discrete lamps and/or messages in a message display area.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1, but it may be implied that the vehicle network may connect to any electronic modules that are present in the vehicle 112. A vehicle system controller (VSC) 148 may be present to coordinate the operation of the various components.

Figure 2:
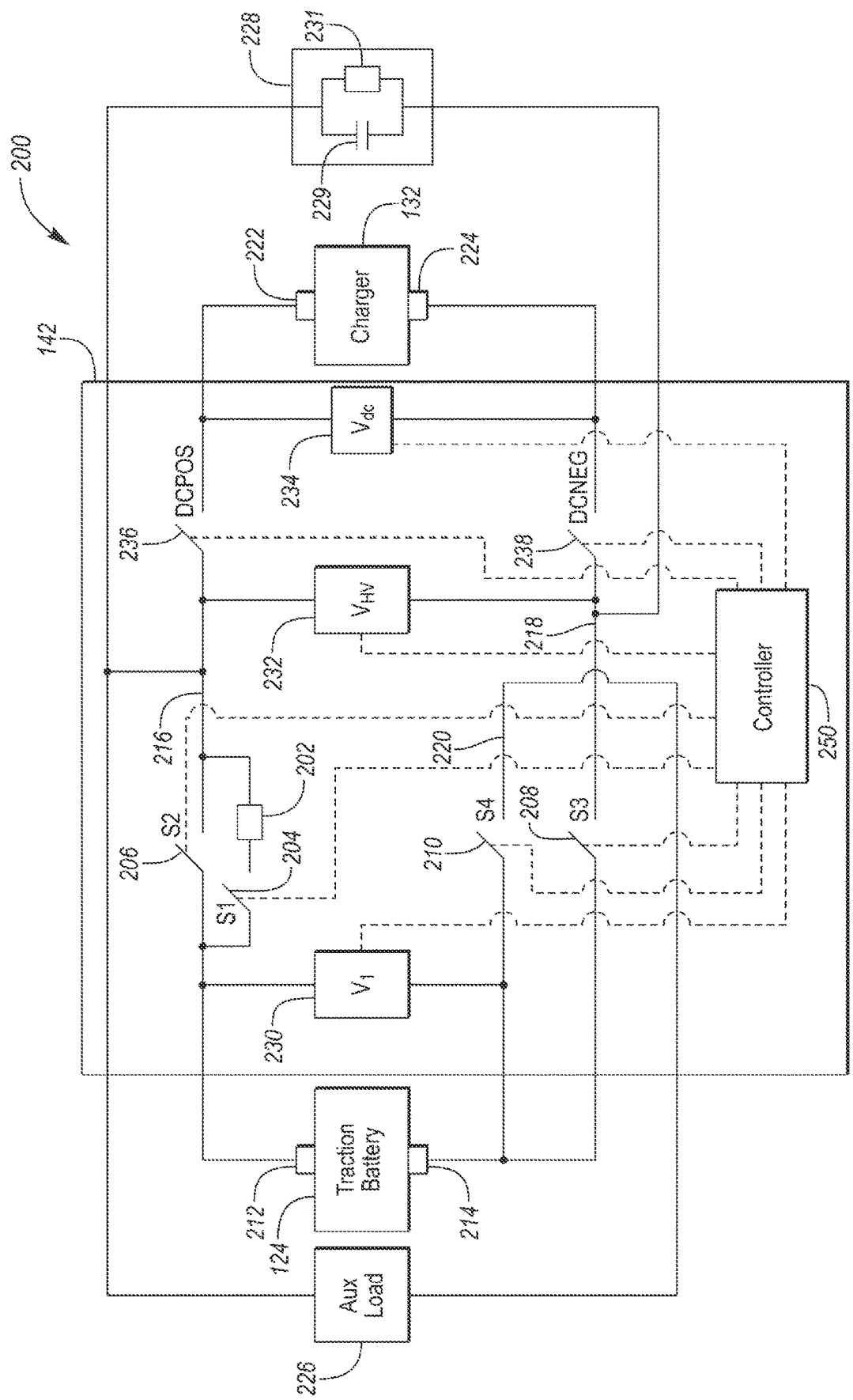
FIG. 2 depicts a possible configuration for contactors in a high-voltage power distribution system for a vehicle.

FIG. 2 depicts a configuration of a high-voltage power distribution system 200 for a vehicle including a plurality of contactors. The contactor module 142 may include a pre-charge contactor 204 (S1) that is electrically coupled in series with a pre-charge resistor 202. The pre-charge resistor 202 may limit the current flowing through the high-voltage bus 152 during startup when the traction battery 124 is initially connected to the high-voltage bus 152. The contactor module 142 may include a main contactor 206 (S2) that is configured to selectively electrically couple a positive terminal 212 of the traction battery 124 to a positive-side conductor 216 of the high-voltage bus 152. The contactor module 142 may include a high-voltage return contactor 208 (S3) that is configured to selectively electrically couple a traction battery return terminal 214 (return terminal of the traction battery 124) to a negative-side or return conductor 218 of the high-voltage bus 152 (e.g., return side of the power electronics module 126). The contactor module 142 may include an auxiliary load return contactor 210 (S4) that is configured to selectively electrically couple the traction battery return terminal 214 to an electrical load return conductor 220 to which an auxiliary load 226 may be connected.

The power distribution system 200 may also include an interface for the charger 132 to interface with the high-voltage bus 152. A charger positive contactor 236 may be electrically coupled between a charger positive terminal 222 and the positive-side conductor 216. A charger return contactor 238 may be electrically coupled between a charger return terminal 224 and the return conductor 218. For example, when charging of the traction battery 124 is desired, the charger 132 may be coupled to the high-voltage bus 152 via the charger positive contactor 236 and the charger return contactor 238. During charge events, the main contactor 206, high-voltage return contactor 208, and the auxiliary load return contactor 210 may be closed.

One or more high-voltage loads 228 may be electrically coupled to the high-voltage bus 152. The high-voltage loads 228 may include a capacitive element 229 and a parallel impedance 231. The capacitive element 229 may hold charge and limit the decay rate of the HV-bus voltage. When disconnected from the high-voltage bus 152, the capacitive element 229 may discharge energy through the parallel impedance 231. Upon disconnection, the voltage across the high-voltage load 228 may decay toward zero. In addition, the capacitive element 229 can cause large inrush currents when not charged. Connection of the high-voltage loads 228 may be established by closing the high-voltage return contactor 208 and the main contactor 206/pre-charge contactor 204.

An auxiliary load 226 may also be electrically coupled between the positive-side conductor 216 and the high-voltage return conductor 220. Connection of the auxiliary load 226 may be established by closing the auxiliary load return contactor 210 and the main contactor 206 or pre-charge contactor 204. The auxiliary load 226 may include the DC/DC converter module 128 that drives the low-voltage bus 154.

The contactors 204, 206, 208, 210, 236, 238 may be electromagnetic switches such as a relay. The contactors may include a coil that opens or closes an associated switch when energized. For example, the contactors may be normally-open contactors such that the switch is opened when the coil is de-energized and closed when the coil is energized. A coil may be energized by applying a voltage across the coil to cause current to flow in the coil. The coils may be electrically coupled to a controller 250 that is configured to provide voltage and current to the coils. In some configurations, the contactors may be solid-state devices such as an Insulated Gate Bipolar Transistor (IGBT) or similar device. The controller 250 may be configured to drive the coils using hardware components and software functions. The controller 250 may be part of the contactor module 142. In some configurations, features of the controller 250 may be performed by one or more external controllers (e.g., a battery control module controller and/or system controller 148). The controller 250 may include a processing unit for executing instructions and programs. The controller 250 may include volatile and non-volatile memory for storing programs and data. The controller 250 may include driver/interface circuitry for operating the contactors.

The power distribution system 200 may include voltage sensors that are configured to measure voltages that are present. A battery voltage sensor 230 may be configured to measure a voltage across the traction battery 124 (battery voltage). A high-voltage bus voltage sensor 232 may be configured to measure a voltage across the high-voltage bus 152 (voltage across positive-side conductor 216 and the return conductor 218 (HV-bus voltage). A charger voltage sensor 234 may be configured to measure the voltage across the charger 132 (charger voltage). In addition, current sensors may be present that are configured to measure the current passing through conductors of the power distribution system 200. The controller 250 may include interface circuitry to properly scale and isolate the signals provided by the voltage and current sensors.

To ensure proper operation, the contactors may be monitored to ensure proper operation. As the controller 250 operates the contactors, the controller 250 may be aware of the desired or commanded state (e.g., open or closed) for each of the contactors. When a contactor is not functioning correctly (e.g., closed when commanded to be open), the controller 250 may generate a diagnostic trouble code to aid in servicing the vehicle. In addition, the controller 250 may inhibit vehicle functions including charging and propulsion. The controller 250 may also cause a display element that is descriptive of the condition to be displayed on the user interface 160.

A contactor may become inoperative due to being welded closed. For example, a contactor may become welded closed when trying to close the contactor in the presence of a large voltage across the contactor. As the contactor is closed, the large voltage may cause a current flow across the switch gap before the switch is fully closed. This current can cause a spark that is hot enough to melt the conductive material and weld the contactor closed. The welded contactor may present issues as the contactor no longer provides an isolation function when welded closed. That is, the contactor cannot be commanded to open and is permanently closed. As such, it is desirable to detect a welded contactor and provide a warning to the operator.

The charge contactors (236, 238) may be used during charge events. A charge event may be initiated by coupling the charge connector 140 to the charge port 134. The controller 250 may perform operations to begin charging the traction battery 124. For example, the controller 250 may initiate a pre-charge cycle by closing the return contactor 208, auxiliary load return contactor 210, and the pre-charge contactor 204 to cause the HV-bus voltage to rise to the voltage level of the traction battery 124. When the HV-bus voltage has reached a voltage within a range of the traction battery voltage, the controller 250 may close the main contactor 206 and open the pre-charge contactor 204. The controller 250 may command the charger 132 to output a voltage that is approximately the voltage of the traction battery 124 before closing the charge contactors 236, 238.

Under ideal conditions, a weld test would be performed on each contactor before and after operation of the contactor. The following discussion is focused on weld testing for the charger positive contactor 236 and the charger return contactor 238. One strategy for performing a weld check may be to open each of the charge contactors 236, 238 individually and check for a weld condition. Using the individual weld check strategy, each of the charge contactors 236, 238 may be tested after a charge cycle. During a charge cycle, both the charger positive contactor 236 and the charger return contactor 238 are operated in a closed state. This allows the charger 132 to electrically couple to the traction battery 124 (assuming other contactors are closed as well) to permit charging.

After the charge cycle is completed, a command may be issued to open the charge contactors 236, 238. The controller 250 may initiate an ordered shutdown sequence. The charger 132 may be commanded to provide zero energy during the shutdown. The controller 250 may first command the charger positive contactor 236 to open, while the charger return contactor 238 remains closed. The expectation is that the charger 132 and high-voltage bus 152 will be isolated upon commanding the charge positive contactor 236 open. The voltage at the charger output may be expected to decay toward zero when the charger positive contactor 236 is opened. The controller 250 may sample the charger voltage sensor 234 to determine the voltage across the charger 132. The controller 250 may also sample the battery voltage sensor 230 and/or the HV-bus voltage sensor 232 to determine the voltage across the traction battery 124 or high-voltage bus 152. If the charger positive contactor 236 has opened, the battery voltage and/or HV-bus voltage may be greater than the charger voltage. If the charger positive contactor 236 is welded closed, the battery voltage and/or HV-bus voltage may be the same as the charger voltage. If the battery voltage/HV-bus voltage and the charger voltage are within a predetermined amount of one another, the controller 250 may diagnose that the charger positive contactor 236 is welded closed.

The above procedure can identify an issue with the charger positive contactor 236. However, at the end of the check with a normally operating charger positive contactor 236 (e.g., the charger positive contactor 236 is in the open state as commanded) the charger voltage may be at a low voltage level. Commanding the charger return contactor 238 to open at this time will not change the state, regardless of whether the charger return contactor 238 has actually opened or not. As such, to test the charger return contactor 238, the system would need to re-close the charger positive contactor 236 and bring the charger voltage back up to the HV-bus voltage. The above sequence could then be performed for the charger return contactor 238.

Note that the voltage measurements may be taken after expiration of a period of time to allow the charger voltage to decay. If one of the charge contactors 236, 238 is welded closed, the charger voltage will be approximately equal to the battery voltage/HV-bus voltage. If the battery voltage/HV-bus voltage and the charger voltage are within a predetermined voltage of one another, the controller 250 may diagnose that the tested charge contactor 236, 238 is welded closed.

The above-described strategy effectively identifies a welded contactor for each of the charge contactors 236, 238 after completion of each charge event. The sequence requires that one of the charge contactors 236, 238 be re-closed. However, the charger-side of the high-voltage bus may be discharged. That is, the HV-bus voltage may be much greater than the charger voltage. Closing one of the charge contactors 236, 238 under this condition may cause damage because of the potentially large voltage difference. Alternatively, additional time may be required to bring the charger 132 back up to the HV-bus voltage. As a result, the above-described strategy is not effective in practice.

As a compromise, the controller 250 may command both the charger positive contactor 236 and the charger return contactor 238 to open. The controller 250 may measure the charger voltage and the HV-bus voltage/battery voltage. If the charger voltage is approximately equal to the HV-bus voltage/battery voltage, a welded contactor issue may be present. However, this strategy may only detect a problem when both charge contactors 236, 238 are welded closed. If only one of the charge contactors 236, 238 is welded closed, the issue may not be detected.

It may be observed that the charge contactor 236, 238 that is first closed is closed into an open circuit. The charge contactor 236, 238 that closes second (last) may have a greater risk of becoming welded as it is completing the circuit. It is more likely that the last of the charge contactors 236, 238 to be closed is affected by a weld event.

A typical strategy is to close the charge contactors in a fixed order. This fixed closing strategy places most of the stress of completing the circuit on one of the charge contactors. Based on the above observation, it may be beneficial to alternate the closing of the charge contactors 236, 238 for each charge cycle/event. This may improve contactor life as the high-stress events are distributed equally between the charge contactors 236, 238. In addition, the weld-check strategy may be adjusted to first open and test the last-closed charge contactor after a charge cycle. The weld check strategy may then be performed on the charge contactor that is opened first after the charge event. If the charger contactor is welded closed, the other contactor may be opened to detect a double weld situation. An advantage of this strategy is that the contactor most likely to be welded closed is checked after each charge event.

The controller 250 may be programmed to, responsive to the start of the charge event, command the charger contactors 236, 238 to close in an order that alternates for successive charge events. Responsive to completion of the charge event, the controller 250 may command the contactors that was closed last at the start of the charge event to open. The controller 250 may compare the charger voltage measured across terminals of the charger 132 to a battery voltage measured across terminals of the traction battery 124. In some configurations, the controller 250 may compare the charger voltage to a high-voltage bus voltage measured across conductors of the high-voltage bus 152. The controller 250 may inhibit subsequent charge events responsive to the charger voltage being within a predetermined voltage of the battery voltage (or high-voltage bus voltage).

If the first opened contactor was determined to be welded closed, the system may continue to determine if there is a double weld issue. The controller 250 may then command the contactor that was closed first at the start of the charge event to open. Responsive to the controller 250 inhibiting subsequent charge events (e.g., detected a welded contactor), the controller 250 may compare the charger voltage to the battery voltage or the high-voltage bus voltage. The controller 250 may inhibit vehicle operation (including propulsion) responsive to the charger voltage being within a predetermined voltage of the battery voltage (or high-voltage bus voltage). The controller 250 may cause a display element indicative of the loss of vehicle operation to be displayed on the user interface 160. The controller 250 may cause a display element indicative of the double contactor weld condition to be displayed on the user interface 160. If a single contactor is welded, controller 250 may cause a display elements indicative of the single contactor weld condition and the loss of charging capability to be displayed on the user interface 160. For example, the controller 250 may provide a signal via the vehicle network to the user interface 160 that activates predetermined display elements.

Figure 3:
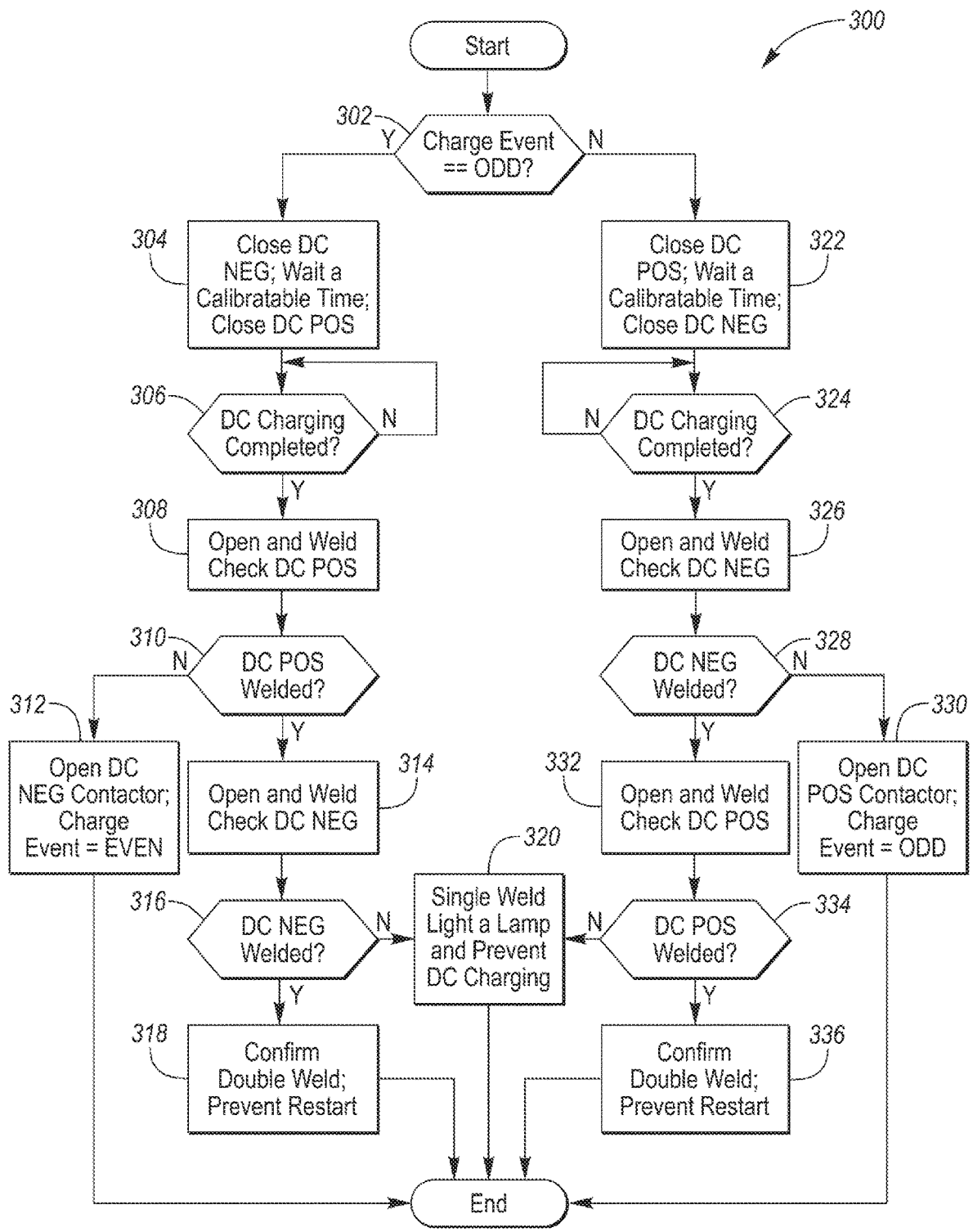
FIG. 3 depicts a flowchart for a possible sequence of operation for controlling the contactors of the high-voltage power distribution system.

FIG. 3 depicts a flowchart for a possible sequence of operations for performing a contactor weld check by alternating which of the contactors is closed first after a charge cycle. At operation 302, the controller 250 may check to determine which of the contactors was closed last after the previous charge cycle. This may be determined by designating each charge event as "ODD" or "EVEN". Each of the charge event designations may define the contactor opening and closing behavior. For example, for ODD charge events the charger return contactor 238 may be opened and closed first. For EVEN charge events the charger positive contactor 236 may be opened and closed first. After each charge event, the charge event identifier may be updated. For example, if the present charge event is identified as ODD, the next charge event will be EVEN. In this manner, the contactors may be closed in an order that alternates for successive charge events.

If the charge event is ODD, operation 304 may be performed. At operation 304, the controller 250 may command the charger return contactor 238 to close first. After waiting a predetermined amount of time, the controller 250 may command the charge positive contactor 236 to close last. Once the charger contactors 236, 238 are closed, the charger 132 may be operated to charge the traction battery 124. At operation 306, the charging process may be monitored. If charging is in progress, operation 306 may be repeated. If the charge process is complete, operation 308 may be performed.

At operation 308, the controller 250 may command the charger positive contactor 236 to open. The controller 250 may perform the weld check strategy on the charger positive contactor 236. The weld check strategy may be performed after a predetermined time delay from opening the contactor to allow the charger voltage to decay. The controller 250 may compare the charger voltage to the HV bus voltage and/or traction battery voltage. The comparison may be performed over a predetermined time interval. The controller 250 may identify that the charger positive contactor 236 is welded responsive to the charger voltage and the HV-bus voltage/traction battery voltage being approximately equal. The controller 250 may identify that the charger positive contactor 236 is not welded responsive to the HV-bus voltage/traction battery voltage being greater than the charger voltage by at least a predetermined amount.

At operation 310, a check may be performed to determine if the charger positive contactor 236 is welded closed. If the charger positive contactor 236 is not welded closed, operation 312 may be performed. At operation 312, the controller 250 may command the charger return contactor 238 to open. The charge event identifier may be updated to EVEN for the next charge cycle. If the charger positive contactor 236 is welded closed, operation 314 may be performed.

At operation 314, the controller 250 may command the charger return contactor 238 to open. The controller 250 may perform the weld check strategy on the charger return contactor 238. The weld check strategy may be performed after a predetermined time delay from opening the contactor to allow the charger voltage to decay. The controller 250 may compare the charger voltage to the HV-bus voltage and/or traction battery voltage. The comparison may be performed over a predetermined time interval. The controller 250 may identify that the charger return contactor 238 is welded responsive to the charger voltage and the HV-bus voltage/traction battery voltage begin approximately equal. The controller 250 may identify that the charger return contactor 238 is not welded responsive to the HV-bus voltage/traction battery voltage being greater than the charger voltage by at least a predetermined amount.

At operation 316, a check may be performed to determine if weld check condition for the charger return contactor 238 is satisfied. If the weld check conditions for the charge return contactor 238 are satisfied, operation 318 may be performed. At operation 318, the controller 250 may store a diagnostic code indicating that a double weld condition is present. In addition, the controller 250 may inhibit further vehicle operation including vehicle propulsion. If the weld check conditions for the charge return contactor 238 are not satisfied, operation 320 may be performed. At operation 320, the controller 250 may store a diagnostic code indicating that a single weld condition is present. The controller 250 may further identify that the charger positive contactor 236 is the contactor that is welded closed. The controller 250 may further inhibit further charge cycles. The controller 250 may further cause a display element to be displayed on the user interface 160.

At operation 302, if the charge event is EVEN, operation 322 may be performed. At operation 322, the controller 250 may command the charger positive contactor 236 to close first for the charge event. After waiting a predetermined amount of time, the controller 250 may command the charge return contactor 238 to close last. Once the charger contactors 236, 238 are closed, the charger 132 may be operated to charge the traction battery 124. At operation 324, the charging process may be monitored. If charging is in progress, operation 324 may be repeated. If the charge process is complete, operation 326 may be performed.

At operation 326, the controller 250 may command the charger return contactor 238 to open first. The controller 250 may perform the weld check strategy on the charger return contactor 238. The weld check strategy may be performed after a predetermined time delay from opening the contactor to allow the charger voltage to decay. The controller 250 may compare the charger voltage to the HV bus voltage and/or traction battery voltage. The comparison may be performed over a predetermined time interval. The controller 250 may identify that the charger return contactor 238 is welded responsive to the charger voltage and the HV-bus voltage/traction battery voltage being approximately equal. The controller 250 may identify that the charger return contactor 238 is not welded responsive to the HV-bus voltage/traction battery voltage being greater than the charger voltage by at least a predetermined amount.

At operation 328, a check may be performed to determine if the charger return contactor 238 is welded closed. If the charger return contactor 238 is not welded closed, operation 330 may be performed. At operation 330, the controller 250 may command the charger positive contactor 236 to open. The charge event identifier may be updated to ODD for the next charge cycle. If the charger return contactor 238 is welded closed, operation 332 may be performed.

At operation 332, the controller 250 may command the charger positive contactor 236 to open. The controller 250 may perform the weld check strategy on the charger positive contactor 236. The weld check strategy may be performed after a predetermined time delay from opening the contactor to allow the charger voltage to decay. The controller 250 may compare the charger voltage to the HV-bus voltage and/or traction battery voltage. The comparison may be performed over a predetermined time interval. The controller 250 may identify that the charger positive contactor 236 is welded responsive to the charger voltage and the HV-bus voltage/traction battery voltage being approximately equal. The controller 250 may identify that the charger positive contactor 236 is not welded responsive to the HV-bus voltage/traction battery voltage being greater than the charger voltage by at least a predetermined amount.

At operation 334, a check may be performed to determine if the welded contactor conditions for the charger positive contactor 236 are satisfied. If the welded contactor conditions for the charge positive contactor 236 are satisfied, operation 336 may be performed. At operation 336, the controller 250 may store a diagnostic code indicating that a double weld condition is present. In addition, the controller 250 may inhibit further vehicle operation including vehicle propulsion. If the weld check conditions for the charger positive contactor 236 are not satisfied, operation 320 may be performed. At operation 320, the controller 250 may store a diagnostic code indicating that a single weld condition is present. The controller 250 may further identify that the charger return contactor 238 is welded closed. The controller 250 may further inhibit further charge cycles.

The controller 250 may wait for the next charge cycle to repeat the sequence. In other configurations, the strategy may be implemented by incrementing and monitoring a counter each charge cycle. For example, the counter value may be checked for odd or even values to distinguish the charge event. The strategy improves contactor durability as the charger positive and return contactors share the burden of being the last to close at the start of charge events. The strategy further uses limited measurements to achieve detection of single and double welded contactor problems. The strategy is effective since it guarantees detection of a double contactor weld condition for each charge event. Further, the success at detecting a single contactor weld condition is high for each charge event. This assumes that the last closed contactor is the one that has the greatest risk of suffering a weld event. Otherwise, a single contactor weld condition is detected by two consecutive charge cycles. In the presence of a single contactor weld condition, safety is maintained since the other contactor is still functioning (otherwise, a double weld condition would have been detected).

The power distribution system 200 of FIG. 2 includes the traction battery 124 that is coupled to the high-voltage bus 152 via the main contactor 206, the precharge contactor 204, the high-voltage return contactor 208, and the auxiliary load return contactor 210. The charger 132 is coupled to the high-voltage bus 152 via the charger positive contactor 236 and the charger return contactor 238. Other configurations of connecting the charger 132 are possible.

Figure 4:
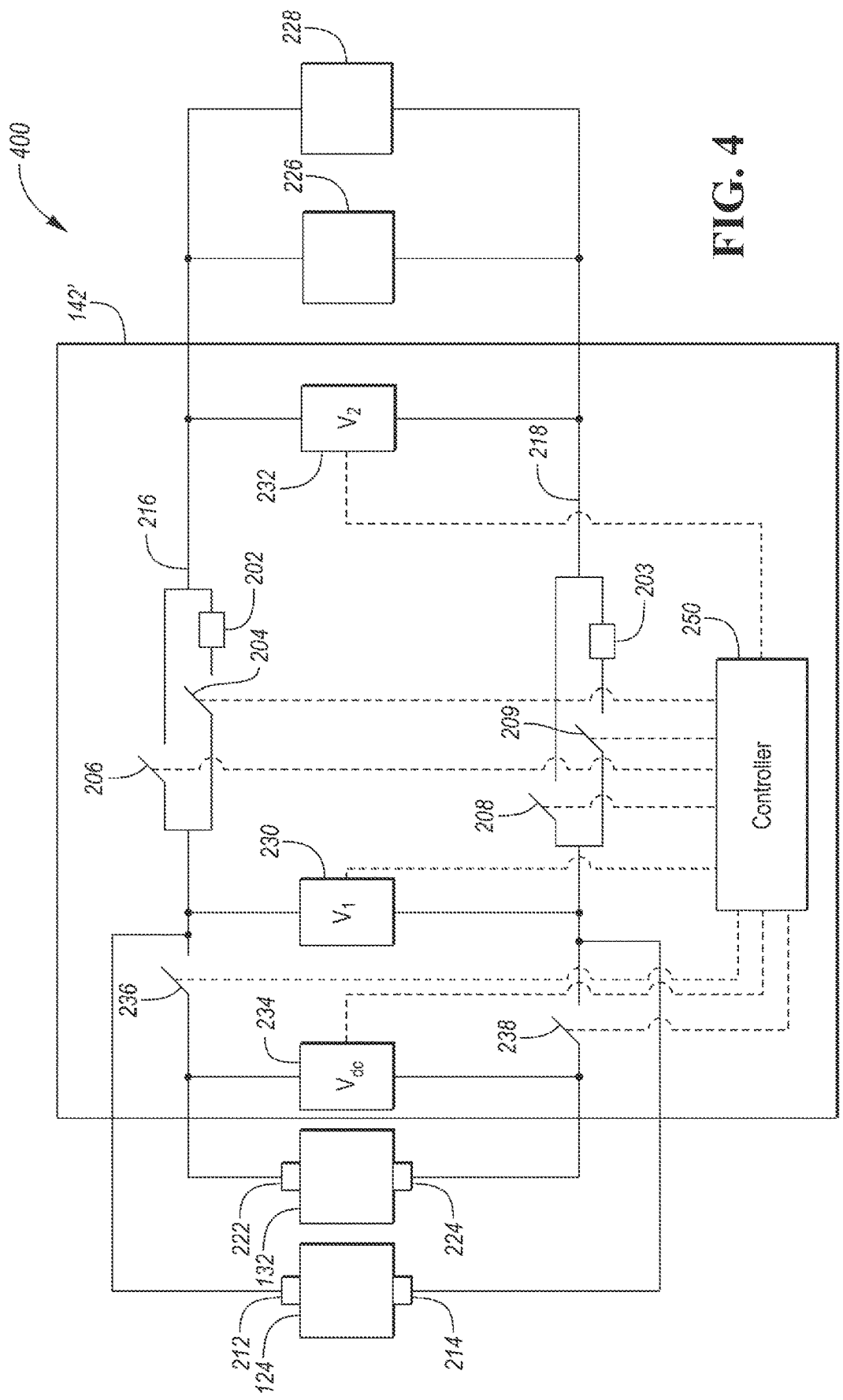
FIG. 4 depicts an alternative configuration for the contactor in a high-voltage vehicle power distribution system for the vehicle.

An alternative power distribution system 400 is depicted in FIG. 4. A contactor module 142' may be configured with a different arrangement of components when compared to the contactor module 142 of FIG. 2. Similarly numbered elements may operate as described above. The following describes the differences. The traction battery 124 may be connected to the positive-side conductor 216 of the high-voltage bus 152 via a main contactor 206 and a precharge contactor 204. The traction battery 124 may connected to the return-side conductor 218 of the high-voltage bus 152 via a return contactor 208 and a return-side precharge contactor 209 (with associated return-side pre-charge resistor 203). The high-voltage loads 228 and auxiliary loads 226 may be electrically coupled to the high-voltage bus 152.

A charger 132 may be electrically coupled to the traction battery 124 via a charger positive contactor 236 and a charger return contactor 238. In this configuration, the charger 132 and traction battery 124 may be electrically coupled during a charge event without applying voltage to the high-voltage bus 152. In such cases, the charger 132 may include a low-voltage power supply to power components on the low-voltage bus 154. The strategy for operating the charger positive contactor 236 and a charger return contactor 238 above is applicable to this configuration as well. The charger contactor control strategy is applicable to other configurations as well.

The contactor sequencing strategy improves the charger contactor life and the weld check strategy guarantees detection of welded charge contactor events before unsafe conditions occur. The weld check strategy is configured to check the highest risk charge contactor each charge cycle.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
a charger;
contactors configured to selectively electrically couple positive and return terminals of the charger to corresponding terminals of a traction battery; and
a controller programmed to (i) responsive to a start of a charge cycle, command the contactors to close in an order that alternates for successive charge cycles, and (ii) responsive to completion of the charge cycle, command a last closed of the contactors to open and, responsive to a charger voltage measured across the terminals of the charger being within a predetermined voltage of a battery voltage measured across the terminals of the traction battery, inhibit subsequent charge cycles.

2. The vehicle of claim 1 wherein the controller is further programmed to, responsive to inhibiting subsequent charge cycles, command a first closed of the contactors to open.

3. The vehicle of claim 2 wherein the controller is further programmed to inhibit operation of the vehicle responsive to the charger voltage being within the predetermined voltage of the battery voltage after commanding the first closed of the contactors to open.

4. The vehicle of claim 3 wherein the controller is further programmed to, responsive to inhibiting vehicle operation, cause a vehicle display to activate a display element indicative of a double welded contactor condition.

5. The vehicle of claim 3 wherein the controller is further programmed to, responsive to inhibiting vehicle operation, cause a vehicle display to activate a display element indicative of a loss of vehicle operation.

6. The vehicle of claim 1 wherein the controller is further programmed to, responsive to inhibiting subsequent charge cycles, cause a vehicle display to activate a display element indicative of a single welded contactor condition.

7. The vehicle of claim 1 wherein the controller is further programmed to, responsive to inhibiting subsequent charge cycles, cause a vehicle display to activate a display element indicative of a loss of charging capability.

8. A power distribution system for a vehicle comprising:
contactors configured to selectively electrically couple positive and return terminals of a charger to corresponding conductors of a high-voltage bus; and
a controller programmed to (i) responsive to a start of a charge cycle, command the contactors to close in an order that alternates for successive charge cycles, and (ii) responsive to completion of the charge cycle, command a last closed of the contactors to open and perform a weld check, and (iii) responsive to a welded contactor condition being satisfied, inhibit subsequent charge cycles.

9. The power distribution system of claim 8 wherein the welded contactor condition includes a first voltage measured across the terminals of the charger being within a predetermined voltage of a second voltage measured across the conductors of the high-voltage bus.

10. The power distribution system of claim 8 wherein the controller is further programmed to, responsive to inhibiting subsequent charge cycles, command a first closed of the contactors to open and perform the weld check.

11. The power distribution system of claim 10 wherein the controller is further programmed to, responsive to the welded contactor condition being satisfied, inhibit vehicle operation.

12. The power distribution system of claim 11 wherein the controller is further programmed to, responsive to inhibiting vehicle operation, output a signal to a vehicle display indicative of vehicle operation being inhibited.

13. The power distribution system of claim 8 wherein the controller is further programmed to, responsive to the welded contactor conditions not being satisfied, command a first closed contactor to open.

14. A method comprising:
by a controller in a vehicle,
responsive to a start of a charge cycle, commanding contactors that selectively electrically couple positive and return terminals of a charger to corresponding conductors of a high-voltage bus to close in an order that alternates for successive charge cycles;
responsive to completion of the charge cycle, commanding a one of contactors that was closed last at the start of the charge cycle to open and performing a weld check; and
inhibiting subsequent charge cycles responsive to a welded contactor condition being satisfied.

15. The method of claim 14 wherein the welded contactor condition includes a first voltage measured across the terminals of the charger being within a predetermined voltage of a second voltage measured across the conductors of the high-voltage bus.

16. The method of claim 14 further comprising, responsive to inhibiting subsequent charge cycles, commanding the contactor that was first closed at the start of the charge cycle to open and performing a weld check.

17. The method of claim 16 further comprising, responsive to the welded contactor condition being satisfied, inhibiting vehicle operation.

18. The method of claim 17 further comprising, responsive to inhibiting vehicle operation, displaying an indicator on a vehicle display indicative of vehicle operation being inhibited.

19. The method of claim 14 further comprising, responsive to the welded contactor conditions not being satisfied, commanding the contactor that was first closed at the start of the charge cycle to open.

20. The method of claim 14 further comprising, responsive to inhibiting subsequent charge cycles, displaying an indicator on a vehicle display indicative of subsequent charge cycles being inhibited.

* * * * *